(12) United States Patent
Ogawa et al.

(10) Patent No.: US 12,028,020 B2
(45) Date of Patent: Jul. 2, 2024

(54) CRYSTAL OSCILLATOR

(71) Applicant: NIHON DEMPA KOGYO CO., LTD., Tokyo (JP)

(72) Inventors: Masato Ogawa, Saitama (JP); Kenji Irie, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 17/926,988

(22) PCT Filed: Jan. 26, 2021

(86) PCT No.: PCT/JP2021/002668
§ 371 (c)(1),
(2) Date: Nov. 21, 2022

(87) PCT Pub. No.: WO2021/240877
PCT Pub. Date: Dec. 2, 2021

(65) Prior Publication Data
US 2023/0198465 A1    Jun. 22, 2023

(30) Foreign Application Priority Data

May 25, 2020 (JP) ................... 2020-090211

(51) Int. Cl.
*H03B 5/04* (2006.01)
*H03B 5/08* (2006.01)
*H03B 5/32* (2006.01)

(52) U.S. Cl.
CPC ............... *H03B 5/04* (2013.01); *H03B 5/08* (2013.01); *H03B 5/32* (2013.01)

(58) Field of Classification Search
CPC ............ H03B 5/32; H03B 5/04; H03B 5/08

USPC .................... 331/116 FE, 176, 158
See application file for complete search history.

(56) References Cited

U.S. PATENT DOCUMENTS 10,511,310 B2 * 12/2019 Chiang ................. H05K 1/181
2018/0248516 A1 * 8/2018 Noto .................... H03H 9/0552

FOREIGN PATENT DOCUMENTS

| JP | 2006014208 | 1/2006 |
| JP | 2011166241 | 8/2011 |

OTHER PUBLICATIONS

"International Search Report (Form PCT/ISA/210) of PCT/JP2021/002668", mailed on Mar. 30, 2021, with English translation thereof, pp. 1-4.

* cited by examiner

*Primary Examiner* — Arnold M Kinkead
(74) *Attorney, Agent, or Firm* — JCIPRNET (57) ABSTRACT

A crystal oscillator internally includes a package storing a crystal unit. The crystal oscillator is configured to include: a substrate having one surface side on which the crystal unit is disposed and another surface side on which a circuit component and a heating element are disposed, the circuit component including an oscillator circuit that oscillates the crystal unit, and the heating element regulating a temperature inside the package; a stepped portion formed at an inner wall of the package to support only an end portion of the substrate from the one surface side such that the crystal unit, the circuit component, and the heating element are spaced from a wall portion of the package; and a wire that connects between a terminal disposed at the heating element and a terminal disposed inside the package without via the substrate.

5 Claims, 6 Drawing Sheets

CRYSTAL OSCILLATOR

CROSS-REFERENCE TO RELATED APPLICATION

This application is a 371 application of the International PCT application serial no. PCT/JP2021/002668, filed on Jan. 26, 2021, which claims the priority benefit of Japan Patent Application No. 2020-090211, filed on May 25, 2020. The entirety of each of the above-mentioned patent applications is hereby incorporated by reference herein and made a part of this specification.

TECHNICAL FIELD

The present invention relates to a crystal oscillator in which a heat regulation in a package storing a crystal unit is performed.

BACKGROUND ART

As a crystal oscillator for obtaining a stable oscillation output by suppressing an influence of an ambient temperature change, there has been known a crystal oscillator (OCXO: Oven Controlled Crystal Oscillator) including a package in which a crystal unit is stored and a heat regulation is internally performed. In a manufacturing process of the OCXO, components of the package are joined, thereby hermetically sealing the package. Specifically, for example, a metal portion of a base that supports a substrate on which various kinds of circuit components are mounted and a peripheral edge portion of a metallic cover formed to expand outward are joined by resistance welding, thereby performing the hermetically sealing in some cases.

For example, as an example of the OCXO, Patent Document 1 discloses one having a configuration in which a crystal unit and a heater (heating element) are mounted to a lower surface of a substrate, an oscillator circuit and a heater are mounted to an upper surface of the substrate, and a peripheral edge portion of the substrate is supported by a stepped portion disposed in a package. Then, in this OCXO, the respective components mounted to the substrate are electrically connected to terminals disposed in the package via terminals disposed at the substrate and bonding wires connected to the terminals.

CITATION LIST

Patent Document

Patent Document 1: Japanese Unexamined Patent Application Publication No. 2006-14208 (FIG. 4, paragraph 0020)

DISCLOSURE OF THE INVENTION

Problems to be Solved by the Invention

Downsizing the OCXO has been desired, and correspondingly, reducing regions as targets of the welding of the package components has been desired. To correspond to such a circumstance, for example, it has been examined that a ceramic base having a depressed longitudinal cross section and a metal lid are used as components of a package, the lid and a metal portion provided at an opening edge of the base are joined by seam welding or the like, thus performing the sealing.

However, for the OCXO including the package manufactured by performing the sealing as described above, a heat of the heating element disposed in the package is transmitted to the package due to a relatively high heat conductivity of the ceramic, and the heat is possibly emitted outside the package. Then, a temperature control inside the package becomes difficult. That is, downsizing the OCXO and a controllability of the temperature inside the package are in a relationship of trade-off.

The present invention has been made in consideration of the above-described circumstance, and its object is to provide a small-sized crystal oscillator that allows obtaining a stable oscillation output.

Solutions to the Problems

A crystal oscillator of the present invention internally includes a package storing a crystal unit. The crystal oscillator includes: a substrate having one surface side on which the crystal unit is disposed and another surface side on which a circuit component and a heating element are disposed, the circuit component including an oscillator circuit that oscillates the crystal unit, and the heating element regulating a temperature inside the package; a stepped portion formed at an inner wall of the package to support only an end portion of the substrate from the one surface side such that the crystal unit, the circuit component, and the heating element are spaced from a wall portion of the package; and a wire that connects between a terminal disposed at the heating element and a terminal disposed inside the package without via the substrate.

Effects of the Invention

According to the crystal oscillator of the present invention, the crystal unit is disposed on the one surface side of the substrate, the circuit component including the oscillator circuit and the heating element are disposed on the other surface side of the substrate, and the end portion of the substrate is supported inside the package such that the components disposed on the substrate are each spaced from the wall portion of the package. Then, the terminal of the heating element is connected to the terminal disposed at the package by the wire without via the substrate. With this configuration, the substrate avoids upsizing, and heat transfer from the heating element to the package is suppressed, thus improving the controllability of the temperature inside the package. Accordingly, the crystal oscillator of the present invention can be downsized, and the stable oscillation output can be obtained.

DESCRIPTION OF PREFERRED EMBODIMENTS

Figure 2:
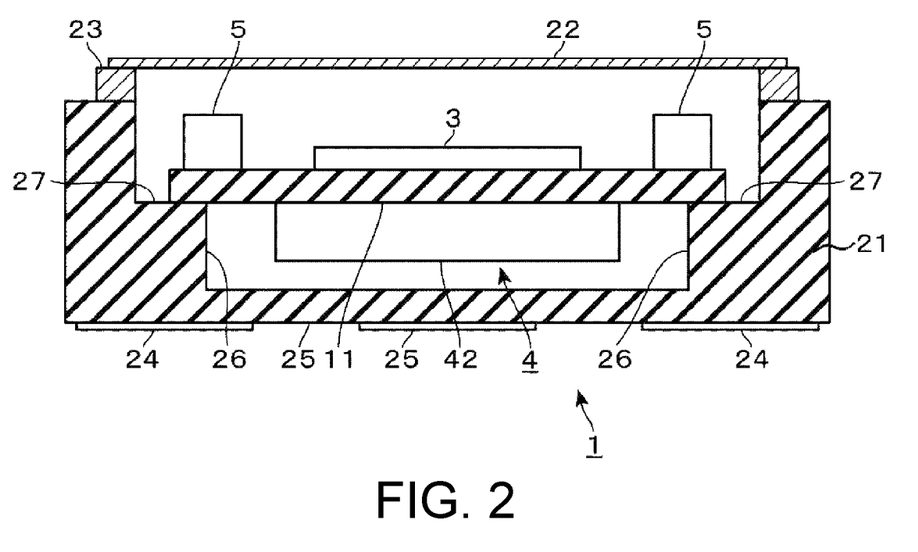
FIG. 2 is a longitudinal front view of the OCXO.
Figure 3:
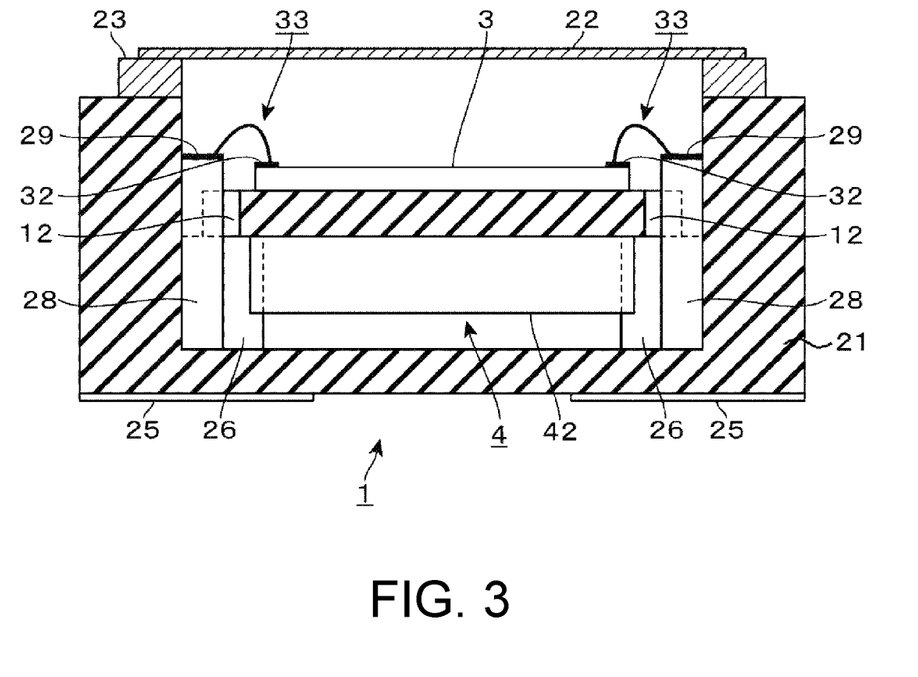
FIG. 3 is a longitudinal side view of the OCXO.
Figure 4:
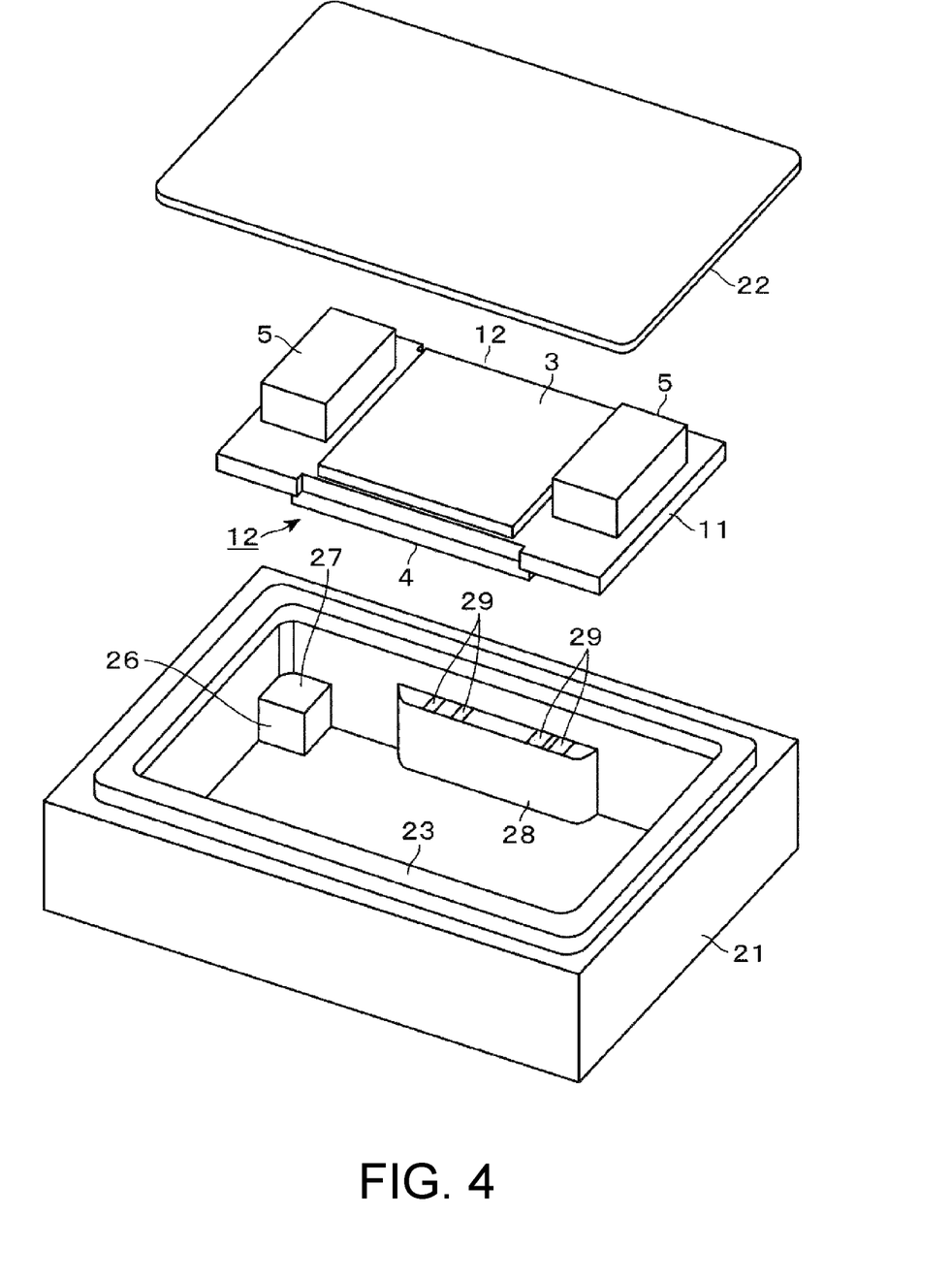
FIG. 4 is an upper surface side exploded perspective view of the OCXO.
Figure 5:
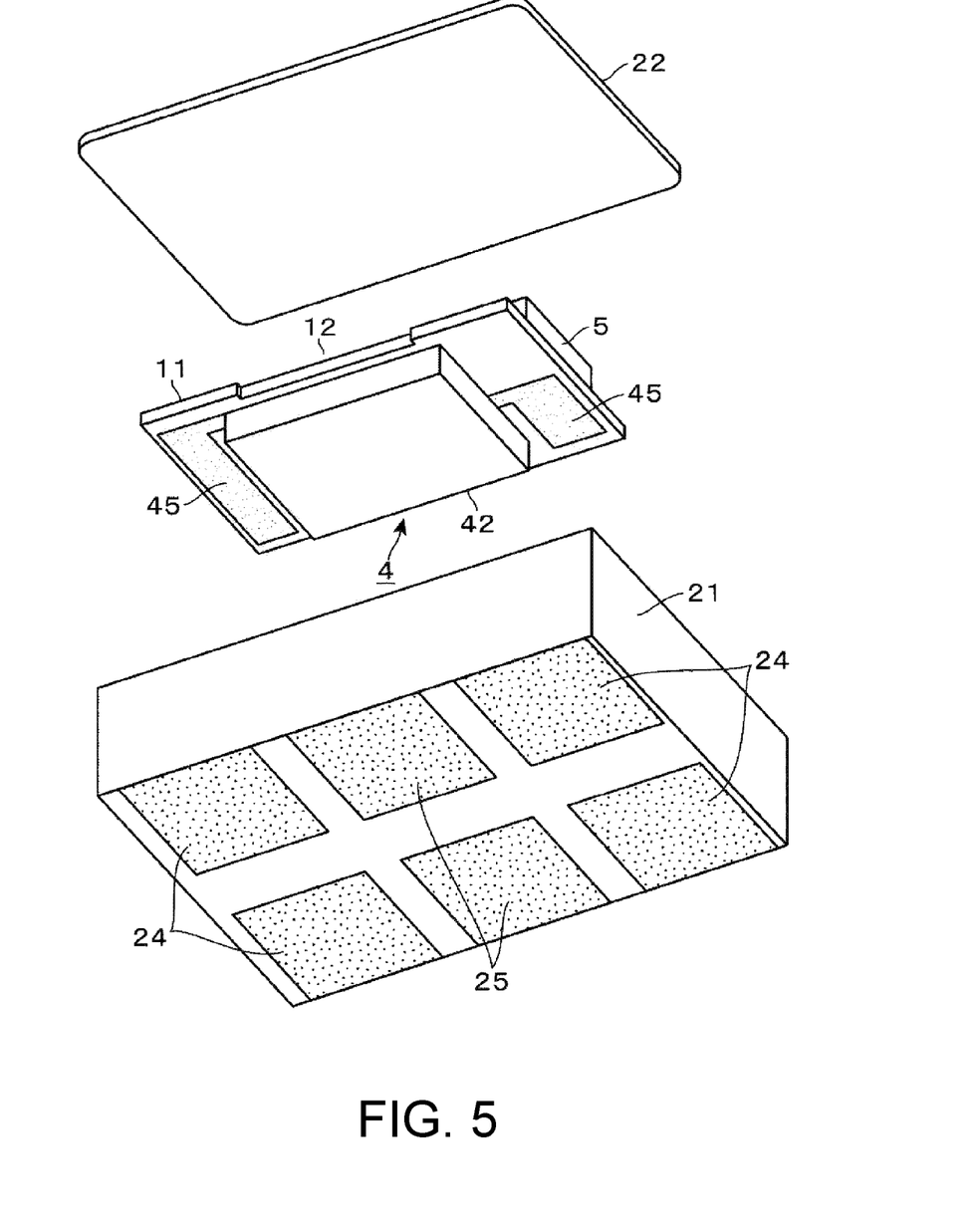
FIG. 5 is a lower surface side exploded perspective view of the OCXO.

An OCXO 1 as a crystal oscillator that includes a package according to one embodiment of the present invention will be described by referring to the transverse plan view of FIG. 1, the longitudinal front view of FIG. 2, the longitudinal side view of FIG. 3, the upper surface side exploded perspective view of FIG. 4, and the lower surface side exploded perspective view of FIG. 5 as necessary. The OCXO 1 includes a substrate 11, a package 2, an Integrated Circuit (IC) chip 3, a crystal unit 4, and two capacitors 5. The IC chip 3, the crystal unit 4, and the capacitors 5 are disposed on the substrate 11, and their arrangements will be described later.

The package 2 that serves as an oven is formed in a rectangular shape, and includes a base 21 and a lid 22. The package 2 is formed in a rectangular shape in plan view. Hereinafter, in the description of the OCXO 1, a long side direction of the rectangular is referred to as a right-left direction, and a short side direction is referred to as a front-rear direction. In the description, a side in which the lid 22 is disposed is referred to as an upper side. However, the directions of up-down, right-left, and front-rear described here are directions for convenience of describing the configuration of the OCXO 1, and the OCXO 1 may be used in any direction. The package 2 has a right-left length of 9 mm or less, more specifically, for example, 7 mm, and the package 2 has a front-rear length of 7 mm or less, more specifically, for example, 5 mm.

The base 21 constitutes a sidewall and a bottom portion of the package 2, and its material is a ceramic. The base 21 has a longitudinal cross section formed in a depressed shape, and therefore, the base 21 is provided with an opening portion that opens upward. A seal ring 23, which is a ring projection, is formed as a metal portion so as to be along an edge of the opening portion. A peripheral edge portion of the lid 22, which is a metal plate, is welded to the seal ring 23, thus providing a hermetically sealed space inside the package 2. The hermetically sealed space is formed in an approximately rectangular shape in plan view.

Metal pads 24, 25 for connecting the OCXO 1 to external equipment are disposed on the lower surface of the base 21, and for example, the four pads 24 and the two pads 25 are disposed. The pads 24 are electrode terminals connected to respective circuits constituting the OCXO 1. That is, the pads 24 are electrically connected to the above-described respective components mounted to the substrate 11, and the OCXO 1 is operated by connecting the respective pads 24 to the electrode terminals of the external equipment disposed outside the OCXO 1.

The insides of the package 2 will be described. In respective four corner portions inside the package 2, lower sides of the sidewall are formed so as to bulge toward the inside of the package 2, thereby forming stepped portions 26 at an inner sidewall of the package 2. From another point of view, the bottom surface rises at the respective four corner portions inside the package 2, thereby forming the stepped portions 26. Upper surfaces of the stepped portions 26 form support surfaces 27 that support the substrate 11 to be parallel to a bottom wall of the package 2 and the lid 22.

Lower portions in the center in the right-left direction of respective sidewalls in the front side and the rear side of the package 2 are also formed so as to bulge toward the inside of the package 2, thereby forming stepped portions 28 that are long in the right-left direction, and the stepped portions 28 are each formed to be higher than the above-described stepped portions 26. A plurality of terminals 29 are formed as patterns of a metal film on an upper surface of each stepped portion 28. The terminals 29 are connected to the above-described pads 24 on the lower surface of the package 2 via conductive paths (not illustrated) formed inside the sidewall and the bottom wall and on the surface of the bottom wall of the package 2. Hereinafter, for avoiding confusion, the stepped portion 26 is referred to as the substrate supporting stepped portion 26, and the stepped portion 28 is referred to as the connection stepped portion 28 in some cases.

Subsequently, the substrate 11 will be described. The substrate 11 is, for example, made of resin, and patterns of a metal film, such as a copper film, are formed on its upper surface side (other surface side) and lower surface side (one surface side). Among the patterns, a heat dissipation pattern that is a pattern on the lower surface side will be specifically described later.

The substrate 11 has an approximately rectangular shape in plan view, and a length in a long side direction and a length in a short side direction are, for example, 5 mm and 3 mm, respectively. The substrate 11 is supported by securing the lower surface sides of its four corner portions to the above-described support surfaces 27 of the substrate supporting stepped portions 26 via an adhesive material (not illustrated), and its long side direction and short side direction are aligned with the long side direction and the short side direction of the package 2, respectively. The side surface of the substrate 11 is spaced from the sidewall of the package 2. In further detail, each of the components (IC chip 3, crystal unit 4, and capacitors 5) disposed on the substrate 11 is spaced from the inner wall of the package 2. Therefore, the substrate 11 and the respective components mounted to the substrate 11 float in the hollow of the package 2 excluding the corner portions of the substrate 11. Cutouts 12 are provided in the center portions in the right-left direction of respective front side and rear side of the substrate 11, thereby avoiding the contact of the substrate 11 with the connection stepped portions 28 of the package 2.

The IC chip 3 and the two capacitors 5 are disposed on the upper surface side of the substrate 11. The capacitors 5 are bypass capacitors, and disposed in respective right and left sides of the substrate 11. The IC chip 3 is disposed in the center portion of the substrate 11 between the capacitors 5. The IC chip 3 is a circuit component that includes a plurality of circuits such as an oscillator circuit to oscillate the crystal unit 4, an amplifier circuit (output circuit) to amplify an output from the oscillator circuit, and a heating element (heater circuit). Although the illustration is omitted, a thermistor as a circuit component to detect a temperature of the crystal unit 4 is disposed on the upper surface or the lower surface of the substrate 11. Depending on the temperature detected by the thermistor, the heat generation amount of the heating element is adjusted by the IC chip 3, thus performing the temperature control so as to have the constant temperature of the crystal unit 4, that is, the constant temperature inside the package 2. The thermistor is also not in contact with the inner wall of the package 2 similarly to the other circuit components.

A large number of terminals are disposed on the upper surface of the IC chip 3. These terminals are referred to as chip terminals 32 for avoiding confusion with the terminals 29 of the package 2 side. A plurality of the terminals in a part of the large number of the chip terminals 32 are connected to the respective terminals 29 of the connection stepped portions 28 of the package 2 by bonding wires 33. That is, the chip terminals 32 are directly connected to the terminals 29 by the bonding wires 33 without via the patterns of the metal film disposed on the substrate 11. The bonding wire 33 is relatively thin, and for example, a diameter of its cross section is 30 μm. The bonding wire 33 is formed of, for example, gold or copper.

A plurality of the terminals in the other part of the large number of the chip terminals 32 are connected to the patterns disposed on the upper surface of the substrate 11 by the bonding wires 33 so as to be electrically connected to the crystal unit 4 and the capacitors 5. However, the terminals in the other part of the chip terminals 32, the patterns on the upper surface of the substrate 11, and the bonding wires 33 connecting between the terminals in the other part and the patterns are not illustrated.

The chip terminals 32 directly connected to the terminals 29 of the package 2 by the bonding wires 33 without via the substrate 11 as described above include a plurality of chip terminals 32 disposed at the heating element. For convenience of explanation, the chip terminals 32 of the heating element are referred to as chip terminals 32A, 32B. The chip terminal 32A is a terminal (Vcc terminal) for applying a supply voltage to the heating element, and the chip terminal 32B is a ground terminal.

With such a configuration in which the chip terminals 32A, 32B of the heating element are directly connected to the terminals 29 of the package 2 by the bonding wires 33, the heat dissipation from the heating element to the outside of the package 2 is suppressed. The suppression of the heat dissipation will be described in more detail. Assume that, instead of directly connecting the chip terminals 32A, 32B to the terminals 29, a configuration in which patterns of a metal film connected to the respective chip terminal 32A and chip terminal 32B are formed on the substrate 11, and the patterns are connected to the terminals 29 of the package 2 by the bonding wires 33 is employed. Alternatively, assume that a configuration in which patterns of a metal film connected to the respective chip terminals 32A, 32B are formed on the substrate 11, and conductive paths connected to the patterns of the substrate 11 and extracted to the outside of the package 2 are disposed at the substrate supporting stepped portions 26 of the package 2 is employed.

However, in those configurations in which the patterns connected to the chip terminals 32A, 32B are formed on the substrate 11, while the heat of the heating element moves to the patterns, that is, the substrate 11, the amount of heat transfer to the package 2 via the corner portions increases because the corner portions of the substrate 11 are in contact with the package 2 as described above, and consequently, the amount of the heat dissipation to the outside of the package 2 increases. Meanwhile, in the configuration in which the chip terminals 32A, 32B of the heating element are directly connected to the terminals 29 of the package 2 by the bonding wires 33, since the patterns of the substrate 11 connected to the chip terminals 32A, 32B are not disposed, the heat is not conducted to the substrate 11 via the patterns, and the heat moves a little to the package 2 via the bonding wires 33 because the bonding wires 33 are thin. Accordingly, the heat of the heating element is easily trapped in the package 2, and the heat dissipation to the outside of the package 2 can be reduced.

Figure 1:
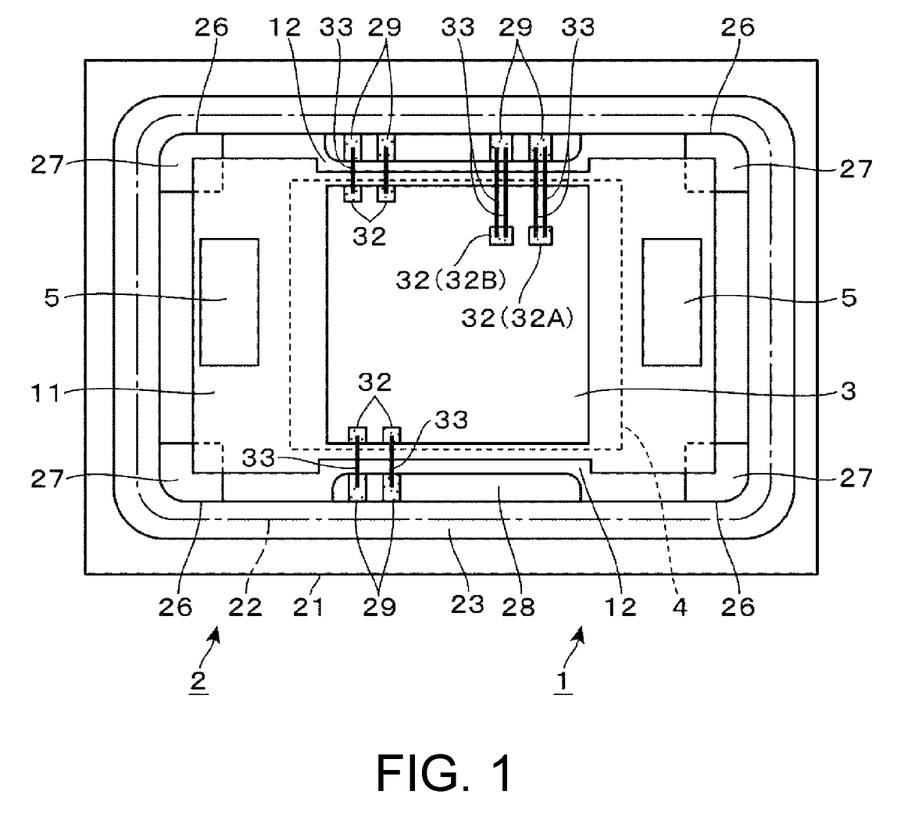
FIG. 1 is a transverse plan view of an OCXO according to one embodiment of the present invention.

The chip terminals 32A, 32B are each connected the terminal 29 of the package 2 by a plurality of, for example, two bonding wires 33 as illustrated in FIG. 1. Accordingly, voltage drop between the chip terminals 32A, 32B and the terminals 29 is suppressed. While a relatively large current flows to the heating element to obtain the large heat generation amount depending on the temperature outside the package 2 (ambient environment temperature), even in such a case, the heat generation for each bonding wire 33 is reduced, thus allowing avoiding a breakage of the bonding wire 33 due to the heat generation with more certainty. The bonding wires 33 connected to each of the chip terminals 32A, 32B are not limited to this, and more than two bonding wires 33 may be connected.

Figure 6:
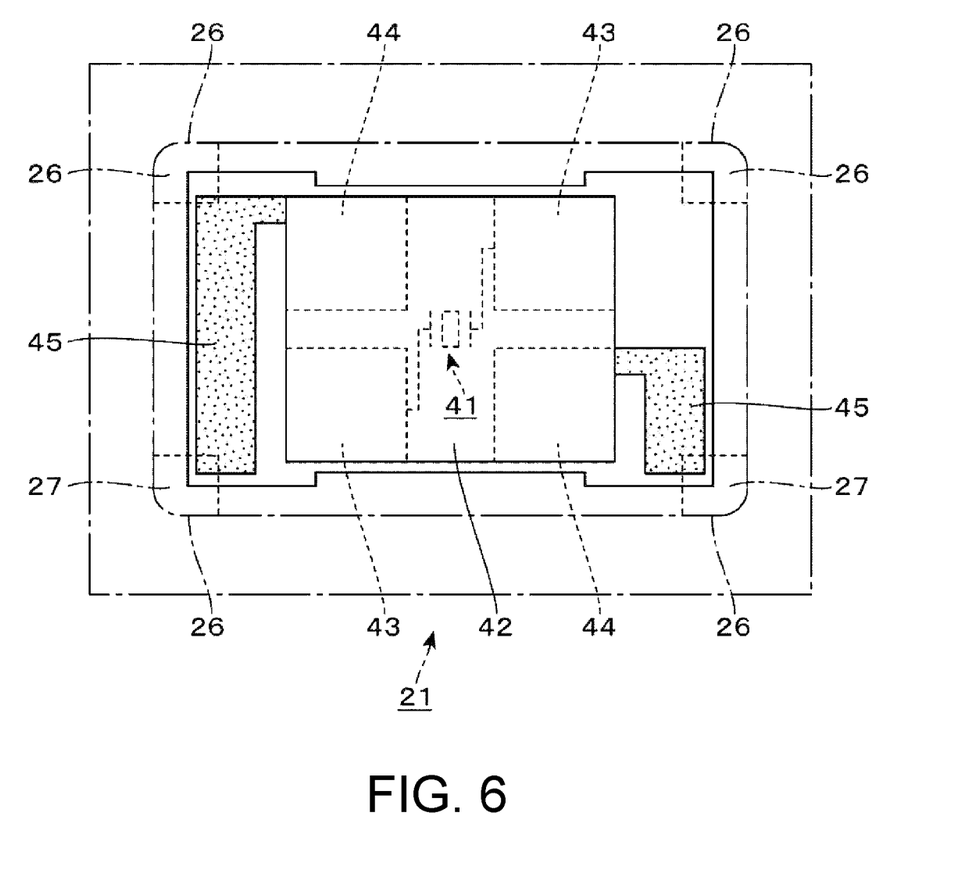
FIG. 6 is a plan view for describing a positional relationship between a substrate and a package each constituting the OCXO.

The following describes the lower surface of the substrate 11 by also referring to schematically illustrated FIG. 6. The crystal unit 4 is disposed in the center of the back side of the substrate 11. This crystal unit 4 is packaged. Specifically, the crystal unit 4 includes a crystal element on which excitation electrodes are formed (for convenience of explanation, referred to as a crystal unit element 41), and additionally, a resonator package 42 that hermetically houses the crystal unit element 41. Four terminals are formed on a surface of the resonator package 42 formed in a rectangular shape, and the four terminals are connected to respective patterns formed on the lower surface of the substrate 11.

Among the four terminals of the resonator package 42, the two terminals connected the excitation electrodes of the crystal unit element 41 via conductive paths (not illustrated) inside the resonator package 42 are indicated by a reference numeral 43. Then, the remaining two terminals are indicated by a reference numeral 44. The terminals 44 are ground terminals, and electrically connected to the pads 24 for grounding among the pads 24 in the lower side of the package 2 via conductive paths (through-hole or pattern) disposed at the substrate 11, the bonding wires 33, and the terminals 29 of the package 2.

Then, patterns that are arranged in respective left side and right side of the crystal unit 4 and connected to the terminals 44 are disposed on the lower surface of the substrate 11. When the patterns are the heat dissipation patterns 45, each of the heat dissipation patterns 45 is formed so as to partially overlap with the support surface 27 of the substrate supporting stepped portion 26 of the package 2. Since the substrate 11 is secured to the package 2 via the adhesive material as described above, the heat dissipation patterns 45 are stacked on the support surfaces 27 of the substrate supporting stepped portions 26 via the adhesive material.

For a role of the heat dissipation pattern 45, the circuits other than the heating element included in the IC chip 3 generate heat by self-power consumption, and their heat generation amounts are uncontrollable different from the heat generation amount of the heating element. Therefore, it is considered that the temperature inside the package 2 deviates from a desired temperature due to the heat generation of the respective circuits, and the heat dissipation patterns 45 are disposed to deal with the problem of the heat generation. In further detail, the heat of the circuits other than the heating element of the IC chip 3 is transferred to the crystal unit 4 via the bonding wires 33 connecting the IC chip 3 to the crystal unit 4 and the conductive paths of the substrate 11. Then, the heat is transferred to the heat dissipation patterns 45 connected to the crystal unit 4, and further, moves to the substrate supporting stepped portions 26 of the package 2 in contact with the heat dissipation patterns 45. Since the conductive paths and the heat dissipation patterns 45 of the substrate 11 are metal, that is, a material having a high conductivity, the heat is efficiently transferred to the substrate supporting stepped portions 26. Then, the heat moved to the substrate supporting stepped portions 26 as described above is dissipated outside the package 2 via the wall portion of the package 2.

Supplementally, a conductive path connecting between the support surface 27 of the substrate 11 and an outer surface of the package 2 is not disposed at the substrate supporting stepped portion 26. That is, the connection stepped portion 28 including the conductive path that connects the terminal 29 to the pad 24 of the outer surface of the package 2 and the substrate supporting stepped portion 26 have mutually different configurations. This is because, when it is assumed that a conductive path connecting the outside of the package 2 to the support surface 27 is disposed at the substrate supporting stepped portion 26, it is concerned that, for the heat generated by the heating element that, an amount of the heat dissipated from the substrate 11 to the outside of the package 2 increases by passing through the conductive path, that is, the heat dissipation amount to the outside via the substrate supporting stepped portion 26 supporting the substrate 11 possibly increases. That is, in the OCXO 1, with the configuration in which the above-described conductive path is not disposed at the substrate supporting stepped portion 26, unnecessary heat dissipation via the substrate supporting stepped portion 26 is suppressed, and the temperature controllability inside the package 2 is improved.

As described above, in the OCXO 1, the IC chip 3 and the crystal unit 4 are disposed in the upper surface side and the lower surface side of the substrate 11, respectively, and the substrate 11 is supported at its corner portions by the stepped portions 26 of the package 2 from the lower surface side. Accordingly, the size of the OCXO 1 can be reduced as exemplified. Then, by connecting the chip terminal 32 of the heating element included in the IC chip 3 to the terminal 29 of the package 2 by the bonding wires 33, dissipation of the heat generated by the heating element to the outside of the package 2 is suppressed. Therefore, since the deviation of the temperature inside the package 2 from a set temperature is suppressed, the stable oscillation output can be obtained for the OCXO 1. Since the crystal unit 4 is disposed at the lower surface side of the substrate 11 in the opposite side of the opening side of the base 21, the crystal unit 4 is less likely to be influenced by an environmental change such as a temperature change outside the package 2, and this contributes to stabilizing the oscillation output.

Furthermore, while the dissipation of the heat of the heating element to the outside of the package 2 is suppressed as described above, the heat generated by the circuits other than the heating element in the IC chip 3 is efficiently dissipated to the outside of the package 2 via the heat dissipation pattern 45 as a metal film for the heat dissipation. Accordingly, for the temperature inside the package 2, the deviation from the set temperature can be suppressed with more certainty.

While the heat dissipation pattern 45 is formed so as to be connected to the terminal 44 as the ground terminal in the terminals 43, 44 of the crystal unit 4 in the above-described example, it is only necessary to be a configuration in which the heat is transferred from the terminal of the crystal unit 4 toward the package 2, and the heat dissipation pattern 45 may be formed to be connected to the terminal 43. Although not illustrated in FIG. 6, patterns (connection patterns) for connecting the crystal unit 4 to the respective components, such as the IC chip 3, in the upper surface side of the substrate 11 are formed on the lower surface of the substrate 11. The heat dissipation pattern 45 may be formed independently of (separately from) the connection pattern, or may be formed to be partially in common with (in contact with) the connection pattern.

In the above-described example, the heat dissipation pattern 45 is formed to overlap with the support surface 27 of the stepped portion 26 for dissipating the heat to the package 2 with more certainty. However, since the amount of heat moving toward the package 2 increases due to the heat radiation as an area of the heat dissipation pattern 45 relatively increases, the heat dissipation pattern 45 may be formed not to overlap with the stepped portion 26 by appropriately setting the area. In the case of not overlapping with the stepped portion 26, for example, the area of the heat dissipation pattern 45 exposed from the lower surface of the substrate 11 is 20% or more of the area of the lower surface of the substrate 11. The area exposed from the lower surface of the substrate 11 is an area of a region not covered with the component such as the crystal unit 4.

While the heat dissipation patterns 45 are formed to overlap with three among the four substrate supporting stepped portions 26 in the example illustrated in FIG. 6, how many stepped portions 26 the heat dissipation patterns 45 are formed to overlap with can be conveniently determined so as to obtain satisfactory temperature controllability inside the package 2. That is, the number of the stepped portions 26 overlapping with the heat dissipation patterns 45 is not limited to three.

While the heating element is included in the IC chip 3 in the above-described example, the heating element may be a single circuit component without being included as described above. The circuit component such as an oscillator circuit may be an individual circuit component without being integrated. The substrate supporting stepped portion 26 supporting the substrate 11 is not limited to the configuration that supports the corner portions as a part of the peripheral edge portion of the substrate 11 as described above, and may be configured to support the whole peripheral edge portion of the substrate 11. However, to avoid the move of the heat of the heating element from the substrate 11 to the package 2, supporting only the corner portions is preferred.

While the package 2 is described as a welded structure, the package 2 is not limited to be manufactured by welding, and for example, the lid 22 may be joined with the base 21 by a brazing material or an adhesive material. Therefore, the seal ring 23 is not necessarily required, and the lid 22 is not limited to be metal. While the technique of the present invention is effective when the base 21 is made of ceramic as described in PROBLEMS TO BE SOLVED BY THE INVENTION, according to the present invention, since the heat dissipation to the outside of the package 2 can be suppressed regardless of the material of the base 21, the base 21 is not limited to be made of ceramic, and may be formed of a material such as a resin.

The embodiment disclosed herein is illustrative in every point and should be considered not to be restrictive. The above-described embodiment may be omitted, replaced, changed, or combined in various manners without departing from accompanying claims and their gist.

(Evaluation Test)

Figure 7:
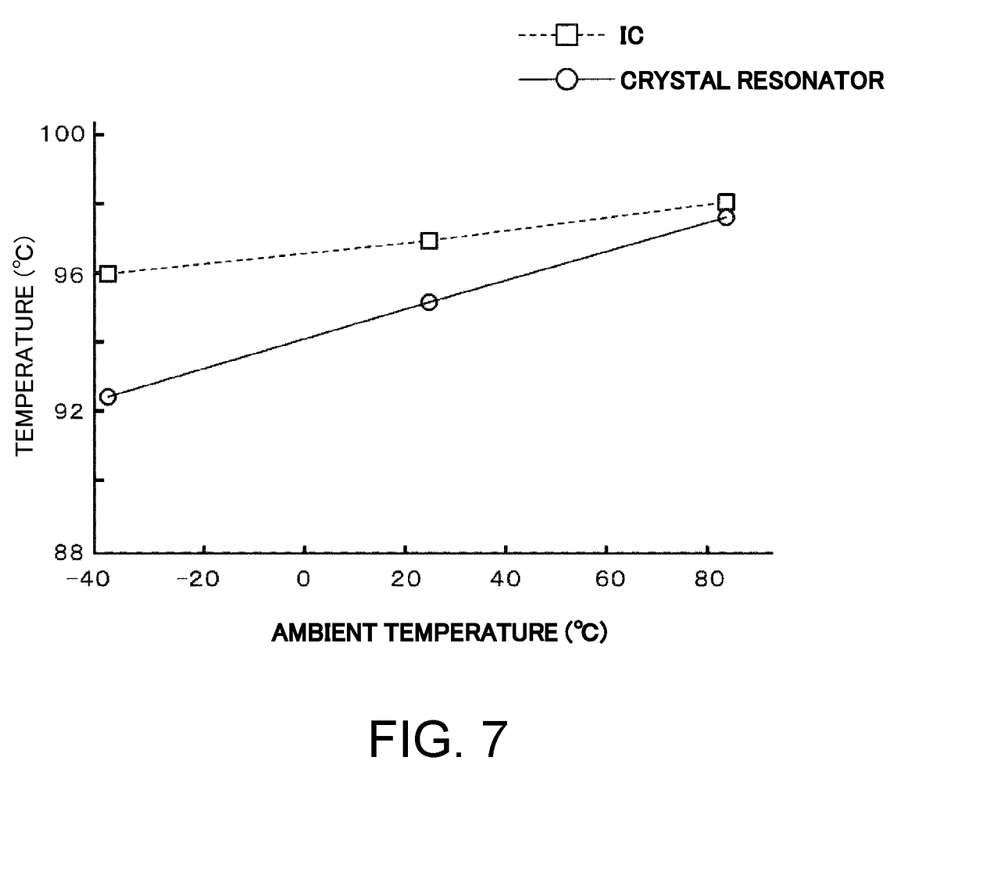
FIG. 7 is a graph for describing a result of an evaluation test.

The evaluation test performed relating to the present invention will be described. The ambient environment temperature of the OCXO 1 was changed by a simulation, and the temperature of the IC chip 3 and the temperature of the crystal unit 4 were each measured. The temperature of the IC chip 3 is, in more detail, a temperature detected by a thermistor included in the IC chip 3, and the temperature of the crystal unit 4 is, in more detail, a temperature detected by a thermistor installed at the proximity of the crystal unit 4. FIG. 7 is a graph illustrating the result of the evaluation test. As illustrated in the graph, as the ambient environmental temperature changes from −40° C. to +85° C., the temperature change of the IC chip 3 is suppressed to about 2° C., and the temperature change of the crystal unit 4 is suppressed to about 5° C. Therefore, it was confirmed that the above-described effect of allowing to stabilize the temperature inside the package 2 as described above was obtained for the OCXO 1.

A simulation similar to the simulation performed for the OCXO 1 was performed using an OCXO configured similarly to the OCXO 1 excluding that the heat dissipation pattern 45 was not disposed at the substrate 11. As a result, it was confirmed that the temperature changes of the IC chip 3 and the crystal unit 4 were more suppressed in the OCXO 1. That is, it was confirmed that the temperature controllability inside the package 2 was improved by disposing the heat dissipation pattern 45.

What is claimed is:

1. A crystal oscillator that internally includes a package storing a crystal unit, the crystal oscillator comprising:
    a substrate disposed in the package and having one surface side on which the crystal unit is disposed and another surface side on which a circuit component and a heating element are disposed, the circuit component including an oscillator circuit that oscillates the crystal unit, and the heating element regulating a temperature inside the package;
    a first stepped portion formed at an inner wall of the package to support only an end portion of the substrate from the one surface side, such that the crystal unit, the circuit component, and the heating element are spaced from a wall portion of the package; and
    a wire that connects between a terminal disposed at the heating element and a terminal disposed at a second stepped portion not touching the substrate, wherein the second stepped portion is formed at a sidewall of the package and the second stepped portion is extending inside the package.

2. The crystal oscillator according to claim 1, wherein a heat dissipation metal film is disposed on the one surface side of the substrate, and the heat dissipation metal film dissipates a heat of the circuit component to an outside of the package via the wall portion of the package.

3. The crystal oscillator according to claim 2, wherein the crystal unit includes a crystal unit package that houses a crystal element and is disposed in the package, and the heat dissipation metal film is connected to a terminal disposed at the crystal unit package.

4. A crystal oscillator that internally includes a package storing a crystal unit, the crystal oscillator comprising:
    a substrate disposing in the package and having one surface side on which the crystal unit is disposed and another surface side on which a circuit component and a heating element are disposed, the circuit component including an oscillator circuit that oscillates the crystal unit, and the heating element regulating a temperature inside the package;
    a stepped portion formed at an inner wall of the package to support only an end portion of the substrate from the one surface side such that the crystal unit, the circuit component, and the heating element are spaced from a wall portion of the package;
    a wire that connects between a terminal disposed at the heating element and a terminal disposed inside the package without connecting to the substrate; and
    a heat dissipation metal film is disposed on the one surface side of the substrate, and the heat dissipation metal film dissipates a heat of the circuit component to an outside of the package via the wall portion of the package,
    wherein the heat dissipation metal film is disposed to be overlapped with a support surface of the stepped portion, and the support surface supports the substrate.

5. A crystal oscillator that internally includes a package storing a crystal unit, the crystal oscillator comprising:
    a substrate disposing in the package and having one surface side on which the crystal unit is disposed and another surface side on which a circuit component and a heating element are disposed, the circuit component including an oscillator circuit that oscillates the crystal unit, and the heating element regulating a temperature inside the package;
    a stepped portion formed at an inner wall of the package to support only an end portion of the substrate from the one surface side such that the crystal unit, the circuit component, and the heating element are spaced from a wall portion of the package;
    a wire that connects between a terminal disposed at the heating element and a terminal disposed inside the package without connecting to the substrate; and
    a heat dissipation metal film is disposed on the one surface side of the substrate, and the heat dissipation metal film dissipates a heat of the circuit component to an outside of the package via the wall portion of the package,
    wherein the stepped portion is configured without a conductive path that connects between the support surface of the stepped portion supporting the substrate and an outer surface of the package.

* * * * *